(12) United States Patent
Takeishi

(10) Patent No.: US 6,462,828 B1
(45) Date of Patent: Oct. 8, 2002

(54) EXPOSURE APPARATUS

(75) Inventor: Hiroaki Takeishi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/356,697

(22) Filed: Jul. 20, 1999

(30) Foreign Application Priority Data

Jul. 23, 1998 (JP) .......................................... 10-208037

(51) Int. Cl.$^7$ ............................................. G01B 11/00
(52) U.S. Cl. ....................................... 356/509; 356/450
(58) Field of Search ................................ 356/509, 500, 356/490, 450; 355/53

(56) References Cited

U.S. PATENT DOCUMENTS

| | | | |
|---|---|---|---|
| 4,858,240 A | * 8/1989 | Pohler et al. | 372/10 |
| 5,682,240 A | 10/1997 | Reditz | 356/349 |
| 5,933,215 A | 8/1999 | Inoue et al. | |
| 5,995,198 A | 11/1999 | Mizutani | 355/53 |
| 6,122,059 A | * 9/2000 | Inoue et al. | 356/450 |

FOREIGN PATENT DOCUMENTS

| | | |
|---|---|---|
| JP | 1-188241 | 7/1989 |
| JP | 3-245932 | 11/1991 |
| JP | 6-267823 | 9/1994 |
| JP | 9-153452 | 6/1997 |
| JP | 10-144596 | 5/1998 |

OTHER PUBLICATIONS

European Search Report dated Feb. 21, 2002, issued in corresponding European patent appln. No. 99305803, forwarded in a communication dated Mar. 6, 2002.

* cited by examiner

Primary Examiner—Frank G. Font
Assistant Examiner—Phil Natividad
(74) Attorney, Agent, or Firm—Fitzpatrick, Cella, Harper & Scinto

(57) ABSTRACT

A scanning exposure apparatus has a wafer stage, a reticle stage, a projection optical system for projecting an image of a reticle onto a substrate on the wafer stage, X-Y laser interferometers for measuring the position of the wafer stage in the X direction, Z interferometers for measuring the wafer stage position in the Z direction, and X-Y laser interferometers for measuring the position of the reticle stage in the X and Y directions, and transfers the image of the reticle onto the wafer by exposure while synchronously driving the wafer stage and reticle stage. The exposure apparatus includes a plurality of laser heads for generating laser beams to be provided to the interferometers. A reference signal is supplied from one laser head to the remaining laser heads to synchronize all laser heads.

35 Claims, 7 Drawing Sheets

SEMICONDUCTOR DEVICE MANUFACTURING FLOW

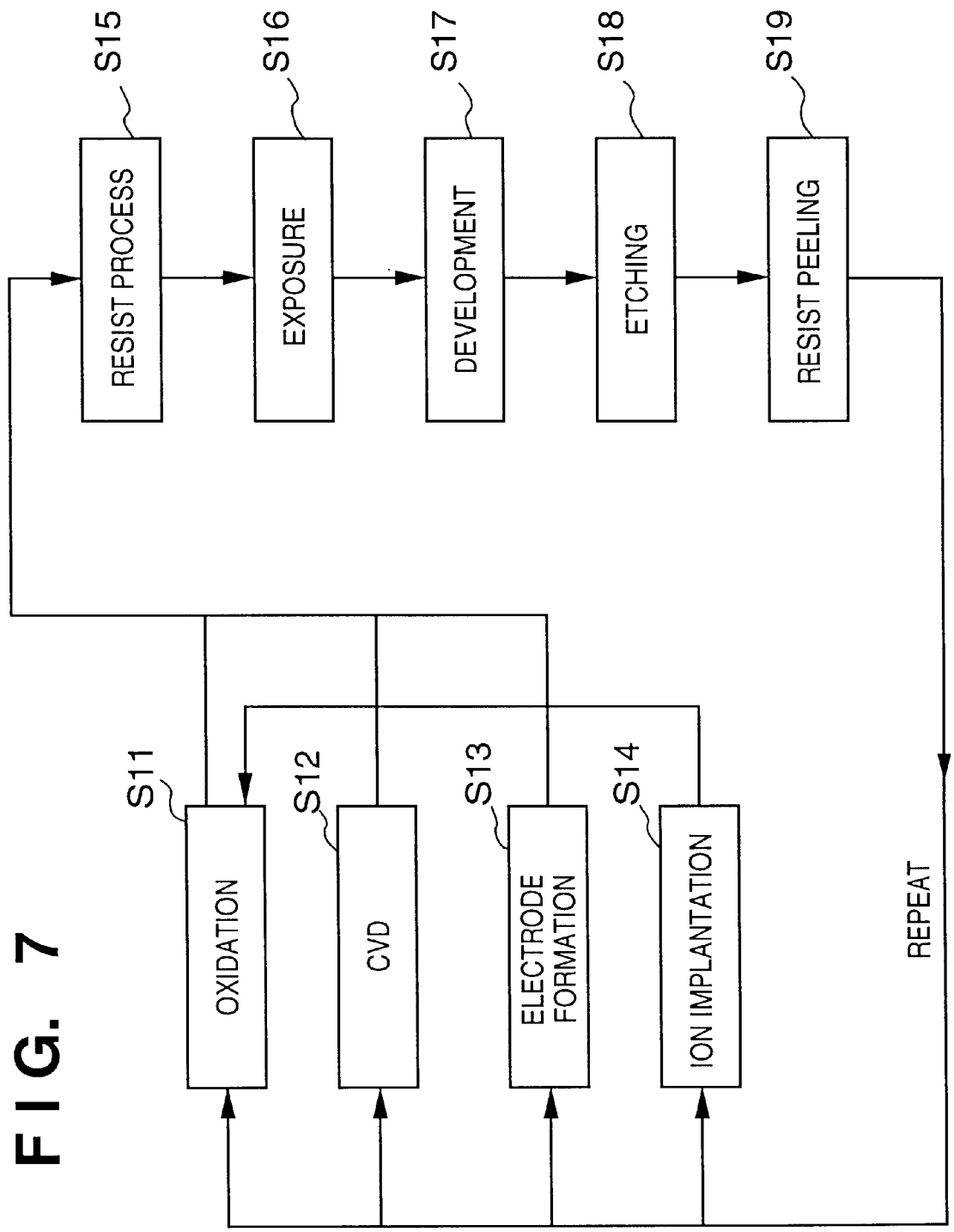

EXPOSURE APPARATUS

BACKGROUND OF THE INVENTION

1. Field of the Invention

The present invention relates to an exposure apparatus and, more particularly, to an exposure apparatus which executes exposure while controlling a substrate stage and master stage on the basis of outputs from interferometers. The present invention can be applied to, e.g., a scanning exposure apparatus.

2. Description of the Related Art

As typical exposure apparatuses used to manufacture semiconductor devices or the like, there are step-and-repeat exposure apparatuses (also referred to as steppers) which sequentially transfer the pattern of a master (reticle or mask) onto a plurality of exposure regions on a substrate (wafer or glass substrate) through a projection optical system by exposure while moving the substrate stepwise, or step-and-scan exposure apparatuses (also referred to as scanners or scanning exposure apparatuses) which repeat step movement and scanning exposure to repeatedly transfer a pattern onto a plurality of regions on a substrate by exposure. Especially, the step-and-scan exposure apparatuses are expected to be a mainstream in the future because they limit light through a slit and use only rays relatively close to the optical axis of the projection optical system, and therefore, allow exposure using a precise and wide-angled fine pattern.

For a step-and-scan exposure apparatus which synchronously moves the reticle stage and wafer stage for scanning during exposure, it is very important to improve the accuracy of synchronization between the reticle stage and wafer stage, unlike a step-and-repeat exposure apparatus in which the reticle and wafer are at rest during exposure. Since a reticle and wafer are moved for scanning during exposure, the synchronization accuracy and movement accuracy of stages are directly reflected on the exposure transfer accuracy.

To measure the stage position, laser interferometers capable of highly accurate distance measurement are normally used. Especially, in a scanning exposure apparatus, since not only the wafer stage but also the reticle stage moves for scanning, the number of axes, i.e., the number of axes of laser beams to be position-measured largely increases. However, improvement of the light amount output from one laser head is limited. In a method of dividing one laser beam into a desired number of axes to prepare measurement light beams, as the number of measurement axes increases, the light amount per measurement light beam decreases to lower the distance measurement accuracy.

In addition, when the number of measurement light beams increases, the number of optical elements for dividing or guiding the laser beams also increases. This complicates the space layout in which the optical elements are disposed and laser beams travel, and therefore, increases limitations on design.

SUMMARY OF THE INVENTION

The present invention has been made in consideration of the above situation, and has as its object to solve the problem of a decrease in light amount in use of a plurality of interferometers and to reduce limitations on layout of interferometers and associated elements.

According to the first aspect of the present invention, there is provided an exposure apparatus which has a substrate stage, a master stage, a projection optical system projecting an image of a master held by the master stage onto a substrate on the substrate stage, a first interferometer measuring a position of the substrate stage, and a second interferometer measuring a position of the master stage, and projects the image of the master onto the substrate by exposure while driving the substrate stage and the master stage on the basis of measurement results by the first and second interferometers, comprising a first light generation section providing first light to the first interferometer, a second light generation section providing second light to the second interferometer, and synchronization means for synchronizing the first light generation section and the second light generation section with each other.

In the exposure apparatus according to the first aspect of the present invention, preferably, for example, the synchronization means comprises a reference signal generation circuit generating a reference signal, and the first and second light generation sections are synchronized with each other by supplying the reference signal from the reference signal generation circuit to the first and second light generation sections.

In the exposure apparatus according to the first aspect of the present invention, the reference signal is preferably, e.g., an excitation signal.

In the exposure apparatus according to the first aspect of the present invention, for example, each of the first and second light generation sections preferably comprises an amplifier amplifying the excitation signal supplied from the reference signal generation circuit, and a laser tube generating a laser beam as the light in accordance with an output signal from the amplifier.

In the exposure apparatus according to the first aspect of the present invention, preferably, for example, the first interferometer is adapted to measure the position of the substrate stage in the horizontal direction, the apparatus further comprises a third interferometer measuring the position of the substrate stage in the vertical direction, and a third light generation section providing third light to the third interferometer, and the synchronization means is adapted to synchronize the first light generation section, the second light generation section, and the third light generation section with each other.

The exposure apparatus according to the first aspect of the present invention preferably further comprises, e.g., a lens-barrel platen supporting the projection optical system, the lens-barrel platen being elastically supported by a mount.

In the exposure apparatus according to the first aspect of the present invention, for example, the substrate stage and the lens-barrel platen are preferably insulated from each other in association with vibration.

In the exposure apparatus according to the first aspect of the present invention, for example, the first and second interferometers are preferably fixed with reference to the lens-barrel platen.

In the exposure apparatus according to the first aspect of the present invention, for example, the master stage is preferably fixed to a master stage platen fixed to the lens-barrel platen through a support frame.

In the exposure apparatus according to the first aspect of the present invention, for example, the first and second light generation sections are preferably fixed with reference to the lens-barrel platen.

In the exposure apparatus according to the first aspect of the present invention, for example, the first and second interferometers and the first and second light generation sections are preferably fixed with reference to the lens-barrel platen.

The exposure apparatus according to the first aspect of the present invention preferably further comprises, e.g., a reaction force reception structure receiving a reaction force generated upon driving the substrate stage.

The exposure apparatus according to the first aspect of the present invention preferably further comprises, e.g., a reaction force reception structure receiving a reaction force generated upon driving the master stage.

The exposure apparatus according to the first aspect of the present invention preferably further comprises, e.g., a first reaction force reception structure receiving a reaction force generated upon driving the substrate stage, and a second reaction force reception structure receiving a reaction force generated upon driving the master stage.

In the exposure apparatus according to the first aspect of the present invention, preferably, for example, the apparatus further comprises a stage base member supporting the substrate stage, and the reaction force reception structure receives a reaction force generated upon driving the substrate stage from the stage base member.

The exposure apparatus according to the first aspect of the present invention preferably further comprises, e.g., an elastic support elastically supporting the reaction force reception structure on a floor, the elastic support damping transmission of vibration having not less than a predetermined frequency between the reaction force reception structure and the floor.

The exposure apparatus according to the first aspect of the present invention preferably further comprises, e.g., a force actuator applying a force between the stage base member and the reaction force reception structure.

In the exposure apparatus according to the first aspect of the present invention, for example, the force actuator preferably comprises a vertical force actuator generating a force in the vertical direction, and a horizontal force actuator generating a force in the horizontal direction.

In the exposure apparatus according to the first aspect of the present invention, for example, the force actuator preferably comprises a linear motor.

In the exposure apparatus according to the first aspect of the present invention, for example, a barycenter of the substrate stage and a position at which the horizontal force actuators apply the force to the stage base member are preferably substantially at the same level.

The exposure apparatus according to the first aspect of the present invention preferably further comprises, e.g., a mount elastically supporting the stage base member on the floor.

In the exposure apparatus according to the first aspect of the present invention, for example, the reaction force reception structure is preferably arranged underneath the stage base member.

In the exposure apparatus according to the first aspect of the present invention, for example, the frequency is preferably higher than a natural frequency of the floor.

In the exposure apparatus according to the first aspect of the present invention, for example, the frequency is preferably higher than 10 Hz.

The exposure apparatus according to the first aspect of the present invention preferably further comprises, e.g., a control unit controlling operation of sequentially transferring a pattern onto a plurality of regions on the substrate by scanning and exposure using a step-and-scan scheme while driving the substrate stage and the master stage in synchronism with each other.

According to the second aspect of the present invention, there is provided an exposure apparatus having a substrate stage and a projection optical system projecting a pattern onto a substrate on the substrate stage, comprising a plurality of interferometers obtaining position information necessary for positioning the substrate and the pattern, a control section controlling an exposure operation on the basis of measurement results by the plurality of interferometers, a first light generation section providing first light to interferometers of the plurality of interferometers, which belong to a first group, a second light generation section providing second light to interferometers of the plurality of interferometers, which belong to a second group, and synchronization means for synchronizing the first light generation section and the second light generation section with each other.

According to the third aspect of the present invention, there is provided an exposure apparatus having a substrate stage and a projection optical system projecting a pattern onto a substrate on the substrate stage, comprising a plurality of interferometers obtaining position information necessary for positioning the substrate and the pattern, the plurality of interferometers being classified into a plurality of groups, a control section controlling exposure operation on the basis of measurement results by the plurality of interferometers, a plurality of light generation sections providing common light to interferometers belonging to the respective groups, and synchronization means for synchronizing the plurality of light generation sections with each other.

According to the fourth aspect of the present invention, there is provided an exposure apparatus which has a substrate stage, a master stage, a projection optical system projecting an image of a master held by the master stage onto a substrate on the substrate stage, a plurality of interferometers measuring positions of the substrate stage and the master stage, and projects the image of the master onto the substrate by exposure while driving the substrate stage and the master stage on the basis of measurement results by the plurality of interferometers, comprising a first light generation section providing first light to interferometers of the plurality of interferometers, which belong to a first group, a second light generation section providing second light to interferometers of the plurality of interferometers, which belong to a second group, and synchronization means for synchronizing the first light generation section and the second light generation section with each other.

According to the fifth aspect of the present invention, there is provided an exposure apparatus which has a substrate stage, a master stage, a projection optical system projecting an image of a master held by the master stage onto a substrate on the substrate stage, a plurality of interferometers measuring positions of the substrate stage and the master stage, and projects the image of the master onto the substrate by exposure while driving the substrate stage and the master stage on the basis of measurement results by the plurality of interferometers, the plurality of interferometers being classified into a plurality of groups, comprising a plurality of light generation sections providing common light to interferometers belonging to the respective groups, and synchronization means for synchronizing the plurality of light generation sections with each other.

According to the sixth aspect of the present invention, there is provided a method of manufacturing a device, comprising the steps of applying a resist to a substrate, placing the substrate on a substrate stage of any one of the above exposure apparatuses and transferring a pattern onto the substrate by exposure using the exposure apparatus, and developing the substrate.

Further objects, features and advantages of the present invention will become apparent from the following detailed description of the embodiments of the present invention with reference to the accompanying drawings.

BRIEF DESCRIPTION OF THE DRAWINGS

FIG. 7 is a flow chart showing a detailed flow of a substrate process.

DETAILED DESCRIPTION OF THE PREFERRED EMBODIMENTS

<Embodiment of Scanning Exposure Apparatus>

Figure 1:
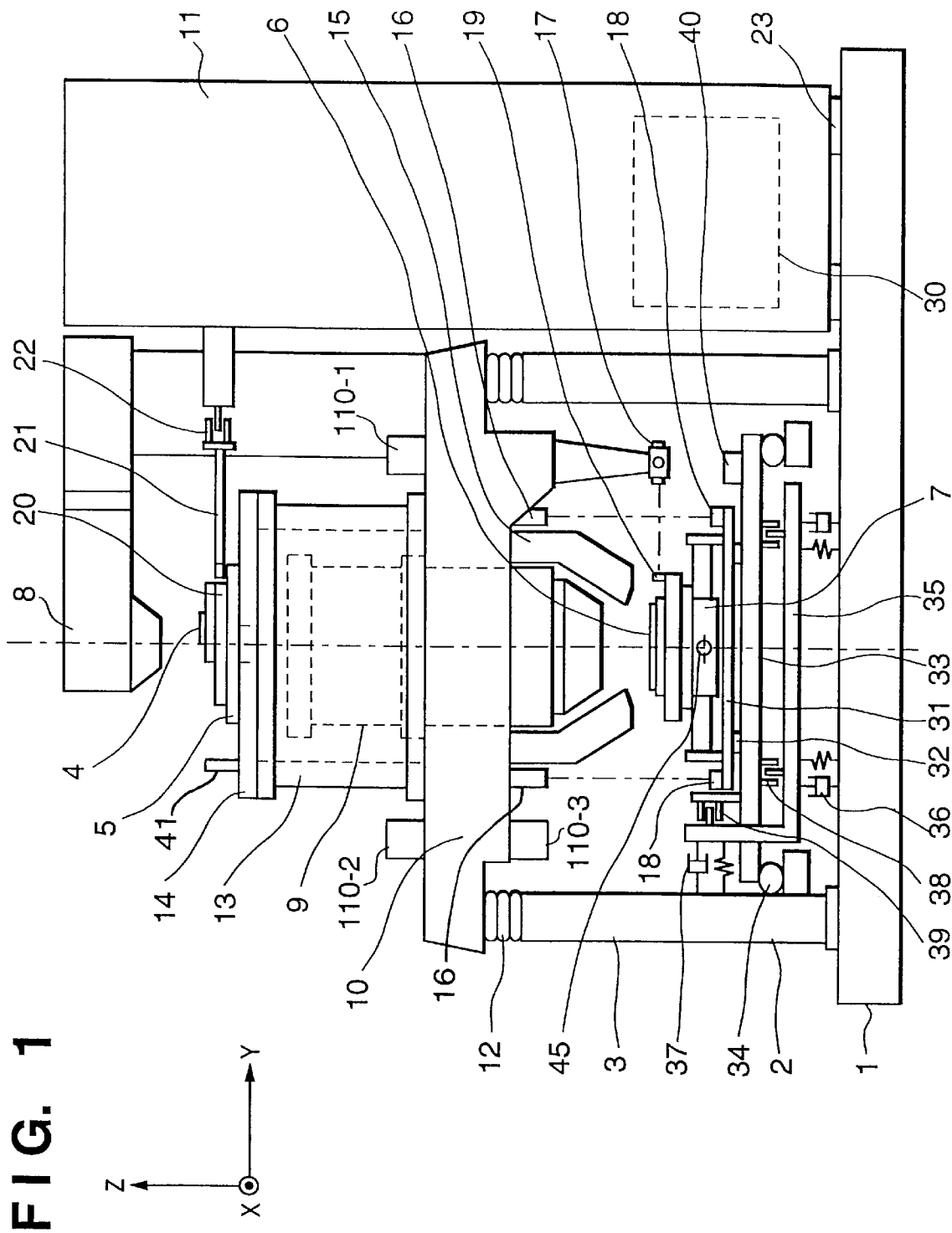
FIG. 1 is a view showing the schematic arrangement of an exposure apparatus according to an embodiment of the present invention.

An embodiment of the present invention will be described below with reference to the accompanying drawings. FIG. 1 is a view schematically showing an exposure apparatus for manufacturing a semiconductor device according to an embodiment of the present invention. In this embodiment, the present invention is applied to a so-called step-and-scan exposure apparatus which transfers a reticle pattern onto a shot region of a wafer by exposure while synchronously scanning both a reticle and wafer, and repeats this operation while moving the wafer stepwise, thereby transferring the pattern onto a plurality of shot regions.

The apparatus shown in FIG. 1 comprises a base frame 2 as the base of the exposure apparatus main body, a movable reticle stage 5 on which a reticle 4 as a master is placed, a movable wafer stage 7 on which a wafer 6 (or glass substrate) as a substrate to be exposed is placed, an illumination optical system 8 for illuminating the reticle 4 with illumination light, a projection optical system 9 for reducing and projecting the pattern of the reticle 4 to the wafer 6 at a predetermined magnification (e.g., 4:1), a lens-barrel platen 10 that holds the projection optical system 9, and an air conditioner room 11 for supplying temperature-controlled clean air.

The illumination optical system 8 incorporates a light source (discharge lamp such as an ultra-high-pressure mercury lamp) or sends illumination light, through a beam line, from a light source unit (excimer laser unit) (not shown) placed on the floor independently of the exposure apparatus. The illumination optical system 8 generates slit light through various lenses or a stop and illuminates the reticle 4 as a master held on the reticle stage 5 with the slit light from the upper side.

The base frame 2 is set on a setting floor 1 of a clean room in a semiconductor manufacturing factory. The base frame 2 is fixed on the floor 1 at high rigidity, and therefore, can be substantially integrated with the floor 1 or be an extension of the floor 1. The base frame 2 includes three or four columns 3 with high rigidity and supports the lens-barrel platen 10 in the vertical direction at the top of each base frame column 3 through three or four active mounts 12. Each active mount 12 incorporates an air spring, damper, and actuator to prevent transmission of vibration from the floor 1 to the lens-barrel platen 10 and actively compensate for any tilt or swing of the lens-barrel platen 10.

The lens-barrel platen 10 holding the projection optical system 9 also supports a reticle stage platen 14 through a reticle support frame 13. An alignment detector 15 for detecting the alignment state between the reticle 4 and wafer 6 is attached to the lens-barrel platen 10, so the two members are aligned using the lens-barrel platen 10 as a reference. To detect the position of the wafer stage 7 with reference to the lens-barrel platen 10, laser interferometers are attached to the lens-barrel platen 10. These include Z interferometers 16 for measuring the position of the wafer stage 7 in the Z direction and X-Y interferometers 17 for measuring the position of the wafer stage 7 in the X and Y directions. As for interferometer mirrors paired with the interferometers, a Z interferometer mirror 18 is fixed to a wafer stage platen 31, and an X-Y interferometer mirror 19 is fixed to the wafer stage 7. The Z interferometer mirror 18 is attached not to a stage base member 33 but to the wafer stage platen 31 due to the following reasons. The stage platen 31 is close to the stage 7 which must be finally positioned. In addition, although the stage base member 33 may slightly deform when actuators 38 and 39 are actuated, the stage platen 31 is rarely influenced and allows accurate measurement. A laser head 110-1 supplies laser beams to the X-Y interferometers 17 for measuring the position of the wafer stage 7. A laser head 110-2 supplies laser beams to interferometers 41 for measuring the position of the reticle stage 5. These laser heads are set on the lens-barrel platen 10.

The reticle stage 5 is set on the reticle stage platen 14 and moved by a driving mechanism including a driving source 20 (linear motor) and a static pressure bearing in the left and right directions (Y direction) in FIG. 1 in the order of acceleration, constant speed, and deceleration in scanning exposure. As will be described later, the stator of the driving source 20 (linear motor) of the reticle stage 5 is connected to the air conditioner room 11 as a reaction force reception structure for the reticle stage 5 through a coupling member 21 and force actuator 22 (linear motor). With this arrangement, a variable thrust generated by the force actuator 22 can be transmitted between the driving source 20 and air conditioner room 11.

The structure around the wafer stage of this embodiment will be described next. The wafer stage 7 with the wafer 6 as a substrate placed thereon can position the wafer 6 in a total of six axial directions, i.e., along moving axes in the horizontal plane (X and Y directions) and in the vertical direction (Z direction) and along rotary axes ($\omega x$, $\omega y$, and $\omega z$) in the respective directions. As the driving source for positioning, a linear motor is employed. Basically, the wafer stage 7 has a two-dimensional stage comprising an X stage which moves straight in the X direction and an X linear motor, and a Y stage which moves in the Y direction perpendicular to the X direction and a Y linear motor. A stage movable in the Z direction, tilt directions ($\omega x$ and $\omega y$), and rotational direction is mounted on the two-dimensional stage. As guides in the respective directions, static pressure bearings are used. For a more detailed structure of the wafer stage 7, see, e.g., Japanese Patent Laid-Opens Nos. 1-188241, 3-245932, and 6-267823.

Figure 2:
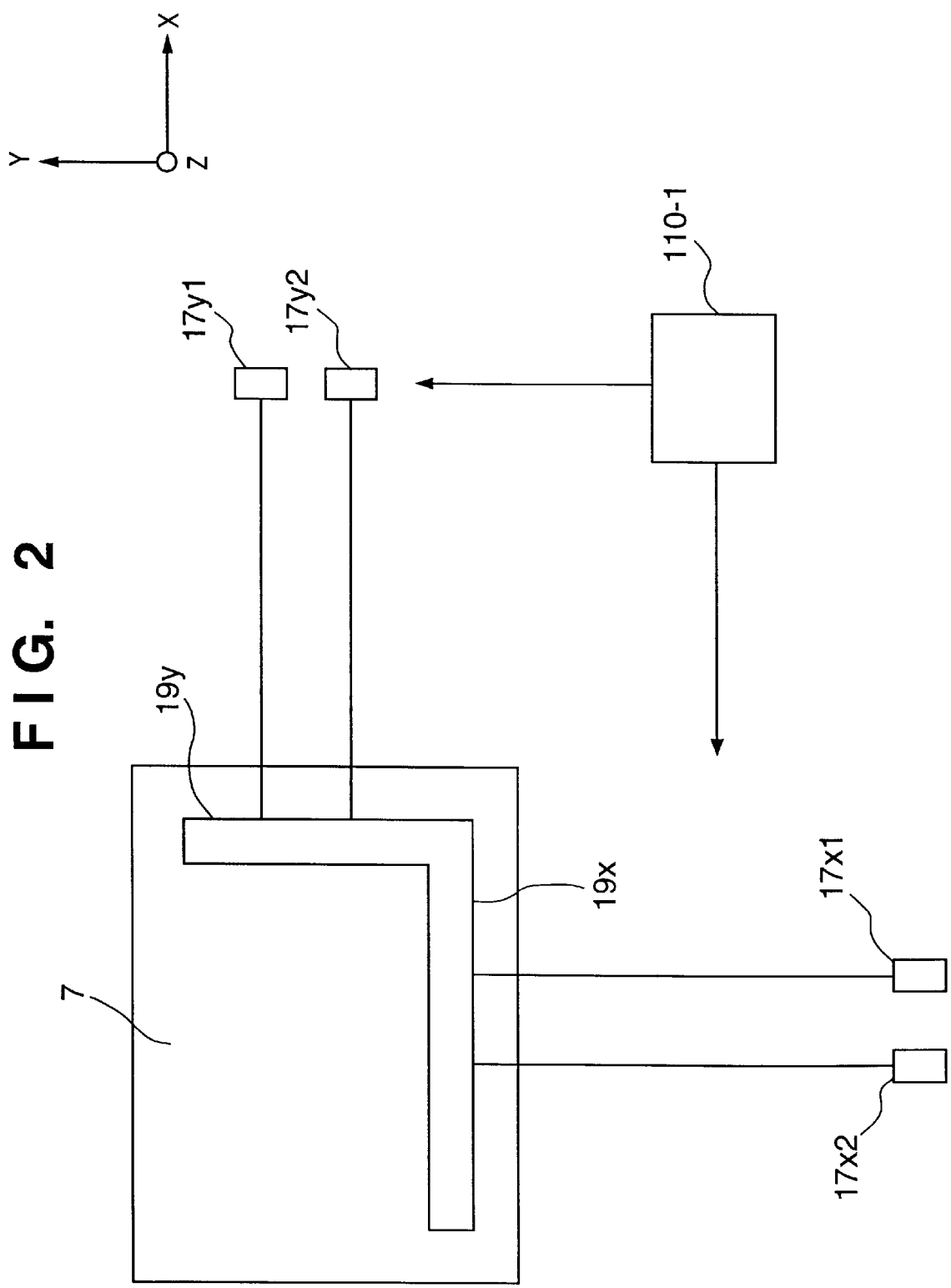
FIG. 2 is a view showing the layout of laser interferometers around a wafer stage of the apparatus shown in FIG. 1.

FIG. 2 shows the layout of laser interferometers around the wafer stage. The X-Y interferometer mirror 19 comprises an X interferometer mirror 19$x$ and Y interferometer mirror 19$y$ and has an L shape. The two mirrors may be integrated or separated. Two laser interferometers are attached in correspondence with each mirror with reference to the lens-barrel platen 10 (FIG. 1). As the X-Y laser interferometers 17, a laser interferometer 17x1 for measuring the position of the wafer stage 7 in the X direction and a laser interferometer 17y1 for measuring the position of the wafer stage 7 in the Y direction are prepared. Additionally, laser interferometers 17x2 and 17y2 are also arranged to measure a yaw (rotation amount about the Z axis) ωz of the wafer stage 7. The yaw ωz can be measured by any one of combinations of the laser interferometers 17x1 and 17x2 and the laser interferometers 17y1 and 17y2, so one of the laser interferometers 17x2 and 17y2 suffices for the measurement of the yaw ωz. Four laser beams to be supplied to these laser interferometers are generated by dividing a laser output from the first laser head 110-1 (FIG. 1) set on the upper surface of the lens-barrel platen 10 into four beams by an optical division element such as a half mirror.

For the reticle stage 5 as well, four X-Y laser interferometers 41 for the reticle stage are mounted on the reticle stage platen 14 with reference to the lens-barrel platen 10, like the wafer stage. A laser beam from the second laser head 110-2 set on the upper surface of the lens-barrel platen 10 is divided into four beams and supplied to the X-Y laser interferometers 41.

Four Z interferometers 16 are mounted on the lower surface of the lens-barrel platen 10 in correspondence with the four corners of the wafer stage platen 31, respectively. A laser beam from a third laser head 110-3 set on the lower surface of the lens-barrel platen 10 is divided into four beams and supplied to the four Z interferometers 16.

The four laser interferometers 17 for measuring the position or posture of the wafer stage 7, four laser interferometers 41 for measuring the position or posture of the reticle stage 5, four laser interferometers 16 for measuring the distance between the lens-barrel platen 10 and wafer stage 7, and three laser heads 110-1, 110-2, and 110-3 are substantially set with reference to the lens-barrel platen 10. For this reason, any relative positional variations between the interferometers can be reduced.

In this embodiment, a total of twelve measurement beams are generated using three different laser heads. This embodiment will be compared with a case (comparative example) in which a laser beam from one laser head is divided into twelve measurement beams. Put simply, if the laser output remains the same, the light amount per measurement beam in this embodiment is three times larger than that in the comparative example. Actually, when a laser beam is divided, a loss is generated in the half mirror or optical elements for a light guide. When this loss is taken into consideration, the light amount per laser beam becomes larger than three times. That is, in this embodiment using a plurality of (n) laser heads, a light amount larger than that of a laser beam of each measurement axis, which is obtained by dividing a laser beam from one laser head, by n times or more, can be obtained. In other words, a compact and lightweight laser head (laser tube) with an output smaller by 1/n or less can be used to obtain a measurement light amount necessary for measurement of each measurement axis.

When a plurality of laser heads are used, as described above, accurate synchronous scanning of the wafer stage 7 and reticle stage 5 may be impeded especially in scanning exposure. This is partly because the data ages of the plurality of laser heads do not match, and a relative measurement error occurs between the measurement axes. In this embodiment, a first laser head 101 for measuring the wafer stage 7, a second laser head 102 for measuring the reticle stage 5, and a third laser head 103 for measuring the distance between the lens-barrel platen 10 and wafer stage 7 are synchronously driven (caused to oscillate laser beams), thereby preventing any data age difference between the laser heads.

Figure 3:
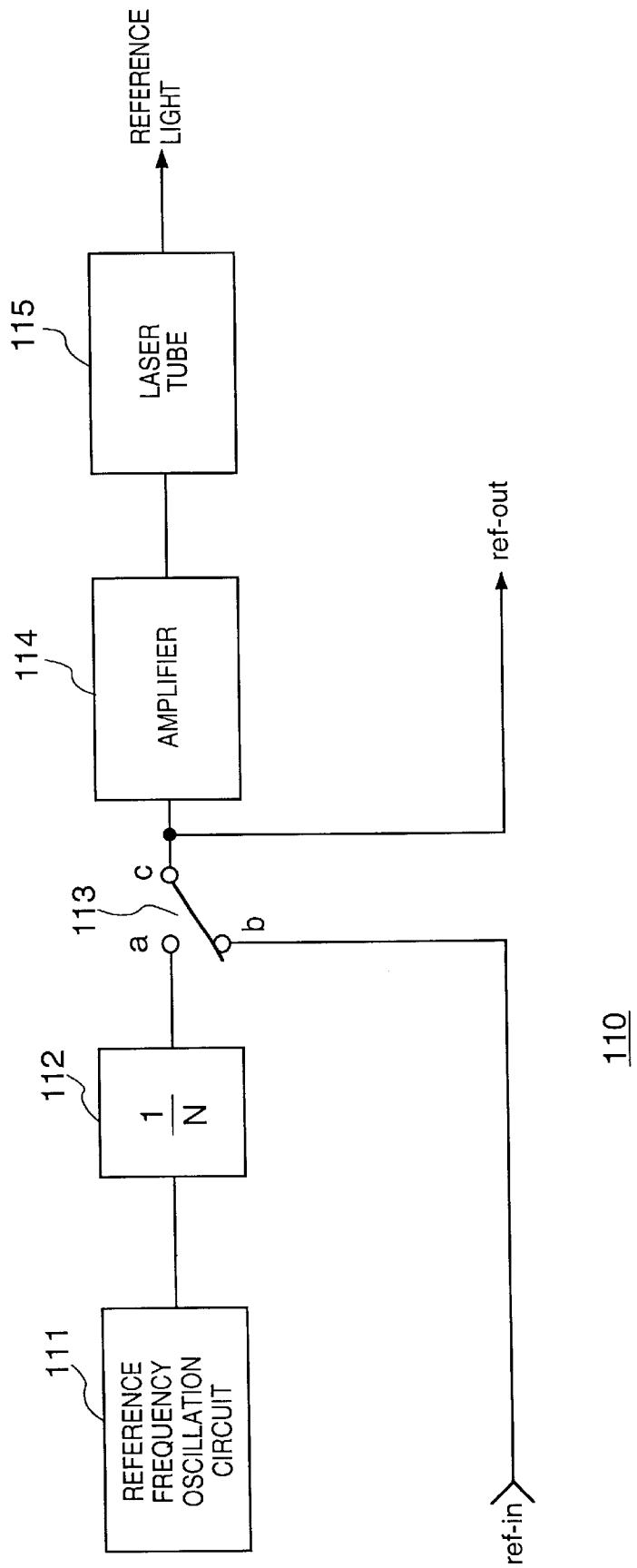
FIG. 3 is a block diagram showing the circuit arrangement of a laser head.

FIG. 3 is a schematic view showing the circuit arrangement of each of the laser heads 110 (110-1, 110-2, and 110-3). Referring to FIG. 3, reference numeral 111 denotes a reference frequency oscillation circuit; 112, a frequency division circuit for dividing the frequency of an output signal from the reference frequency oscillation circuit 111 by N; 113, a switch for selecting one of an excitation signal generated by the frequency division circuit 112 and an excitation signal input from a reference signal input terminal ref-in; 114, an amplifier for amplifying the excitation signal; and 115, a laser tube for oscillating a laser beam with a desired frequency in accordance with the excitation signal output from the amplifier 114 and outputting a laser beam (reference light for interferometer).

Figure 4:
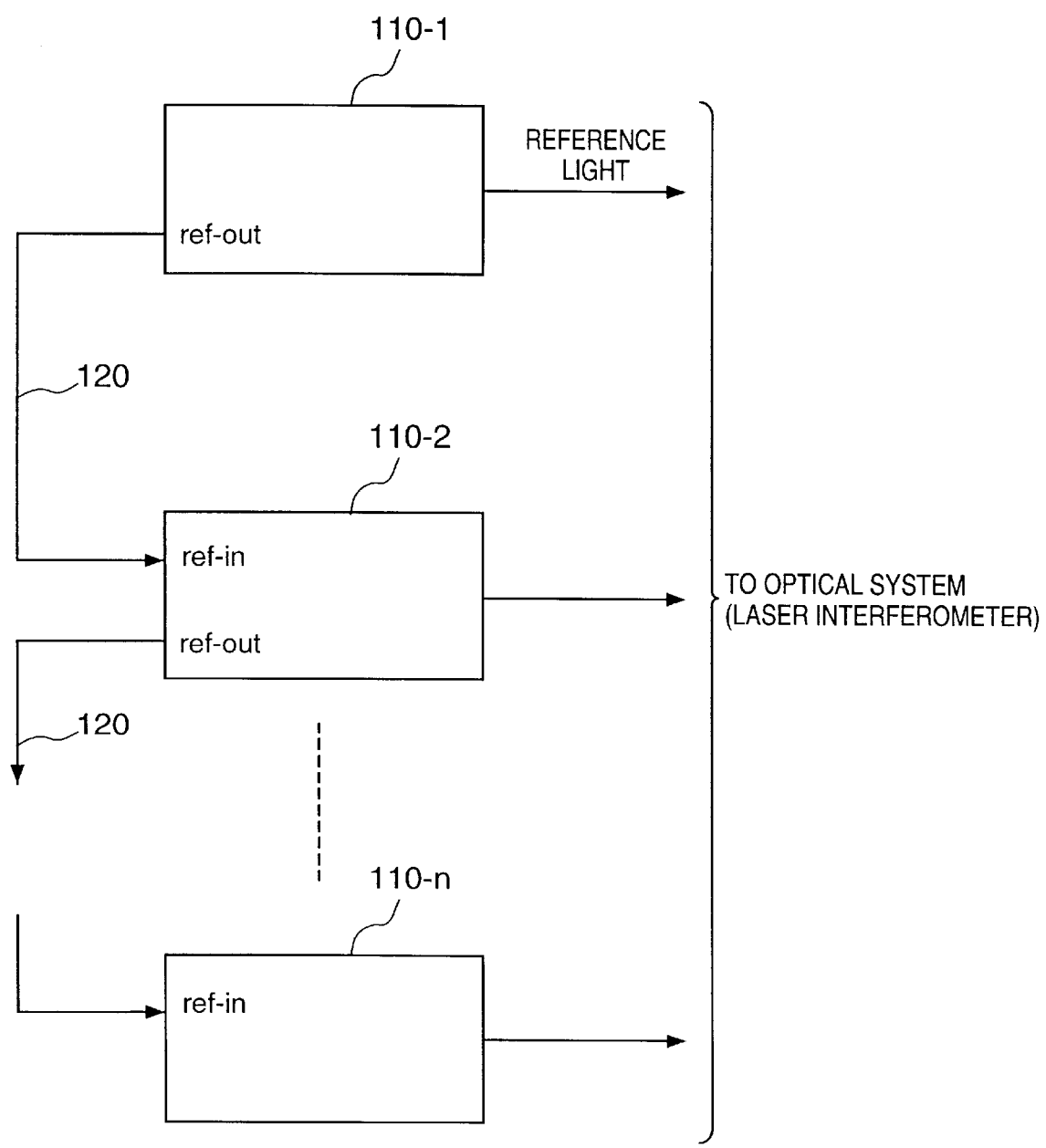
FIG. 4 is a diagram showing a connection for synchronously driving n laser heads shown in FIG. 3 connected.

FIG. 4 is a diagram showing a connection for synchronously driving n (in this embodiment, n=3) laser heads. Referring to FIG. 4, the laser heads 110-1 to 110-n shown in FIG. 3 are connected in series by cables 120 to transmit a reference signal (sync signal). The laser head 110-1 sets the switch 113 to the side of a contact a (FIG. 3) to supply an excitation signal generated in the internal circuits (111 and 112) to the amplifier 114 and also supply the excitation signal to the reference signal output terminal ref-out as a reference signal. In each of the remaining laser heads 110-1 to 110-n, the switch 113 is set to the side of a contact b to supply a reference signal input from the upstream-side laser head to the reference signal input terminal ref-in to the amplifier 114 as an excitation signal. The excitation signal supplied to the amplifier 114 is also supplied to the reference signal output terminal ref-out of the self circuit. As a result, the excitation signal generated by the reference frequency oscillation circuit 111 and frequency division circuit 112 of the laser head 110-1 is supplied to the amplifiers 114 of the laser heads 110-1 to 110-n. The laser tubes 115 of the laser heads oscillate laser beams with the same frequency as that of the excitation signal from the laser head 110-1. That is, the laser tubes of the laser heads 110-1 to 110-n output laser beams in synchronism, i.e., in phase. When the data ages of the laser heads are matched with each other to reduce the relative difference between pieces of positional information of the stages sampled, the wafer stage and reticle stage whose positions are controlled using these pieces of positional information can be moved for scanning at a high synchronization accuracy.

Referring back to FIG. 1, the wafer stage 7 is supported by the wafer stage platen 31 and moves on the X-Y horizontal guide surface (guide surface) of the wafer stage platen 31. The wafer stage platen 31 is supported on the stage base member 33 by three (or four) support legs 32. The support legs 32 have a high rigidity and have no damping function. The stage base member 33 is supported at three portions by the base frame 2 from the lower side through three mounts 34. Most of the weight of the stage base member 33 and members mounted on the stage base member 33 is basically supported by the three mounts 34. The weight received by the mounts 34 is received by the base frame 2 which is substantially integrated with the floor 1. Hence, the weight of the wafer stage 7 is essentially supported by the floor 1. As the mounts 34, air springs capable of supporting a large weight are used.

A reaction force reception structure 35 (reaction force reception pallet) with a large mass is located immediately underneath the stage base member 33. Since the reaction force reception structure 35 is located below the stage base member 33, the occupation area, i.e., so-called footprint of the apparatus on the floor 1 can be reduced.

The reaction force reception structure 35 is supported in the vertical direction by the floor 1 through four vertical elastic supports 36. In the horizontal direction, the reaction force reception structure 35 is supported by supporting the stage base member 33 on the side surfaces of the columns 3 (or side surfaces of members fixed to the floor 1) through horizontal elastic supports 37 arranged in the X and Y directions, respectively (FIG. 1 illustrates only the horizontal elastic support 37 in the Y direction). Each of the vertical and horizontal elastic supports 36 and 37 has a spring element and damper element. For example, antivibration rubber members or air springs can be used as the vertical and horizontal elastic supports 36 and 37. As the spring element, a spring or a leaf spring is suitable, and as the damper element, oil viscosity or electromagnetic fluid is suitable. The fact that the elastic support has a spring element and damper element means that it has a mechanical filter function of damping transmission of vibration within a predetermined frequency range. In this embodiment, the elastic supports damp transmission of high-frequency vibration containing at least the natural frequency of the floor and that of the apparatus. In FIG. 1, the horizontal elastic supports 37 are interposed between the reaction force reception structure 35 and the columns 3 of the base frame 2. However, the horizontal elastic supports 37 may be inserted between fixed members 41 fixed to the floor 1 and the reaction force reception structure Force actuators for generating thrusts in the vertical and horizontal directions are inserted between the stage base member 33 and reaction force reception structure 35. For the vertical direction, a plurality of (four) vertical force actuators 38 are used. For the horizontal direction, a plurality of (two) force actuators are disposed in correspondence with the scanning exposure direction (Y direction). When viewed from the upper side, the four vertical force actuators 38 are located at almost the same positions as those of the four vertical elastic supports 36. Force transmission between the stage base member 33 and reaction force reception structure 35 can be controlled by variable thrusts generated by these force actuators. The level of the barycenter (indicated by a barycenter symbol 45 in FIG. 1) nearly equals the level of the position of force action of horizontal force actuators 39. For this reason, since a compensation force can be applied to a position at roughly the same level as that where the reaction force acts, the reaction force can be effectively canceled.

An acceleration sensor 40 is attached on the stage base member 33 to measure the acceleration in the vertical and horizontal (Y) directions. The acceleration sensor 40 may be attached on the wafer stage platen 31. As the force actuators 22, 38, and 39, a microstroke linear motor is preferable because of its high control response speed and excellent mechanical vibration damping function due to the noncontact structure of the stator and movable element. Alternatively, an electromagnetic actuator using an electromagnetic force, a fluid actuator using a fluid pressure such as pneumatic pressure or hydraulic pressure, or a mechanical actuator using a piezoelectric element can be used.

In this embodiment, the reticle stage 5 and projection optical system 9 which are substantially integrated through the lens-barrel platen 10 are substantially supported on the floor 1 from the lower side through the active mounts 12 and the columns 3 of the base frame 2. On the other hand, the wafer stage 7 and stage base member 33 are substantially supported on the floor 1 from the lower side through the mounts 34 and base frame 2. The mounts 34 will be defined as first mounts, and the active mounts 12 will be defined as second mounts. The wafer stage 7 and reticle stage 5 are independently supported on the floor 1 through the first and second mounts, respectively, thereby forming a system free from interference even upon occurrence of vibration or swing.

The stage base member 33 is supported on the floor from the lower side through the mounts 34. The reaction force reception structure 35 is supported on the floor from the lower side through the vertical elastic supports 36. These two members are independently supported by the floor except the force actuators (38 and 39).

The Z interferometers 16 are provided to control the relative positional relationship between the wafer stage 7, reticle stage 5, and projection optical system 9, which is generated when the wafer stage 7, reticle stage 5, and projection optical system 9 independently vibrate and, more particularly, the distance in the Z direction in exposure.

The air conditioner room 11 as a reaction force reception structure of the reticle stage 5 is supported on the floor 1 from the lower side through elastic supports 23 having a damping function. The elastic supports 23 serve as mechanical filters and damp transmission of vibration containing at least the natural frequency of the floor (e.g., 20 to 40 Hz) and that of the exposure apparatus (e.g., 10 to 30 Hz) and other higher frequency components.

The air conditioner room 11 incorporates a blower fan, temperature adjustment unit (heater or refrigerator), chemical filter, and the like and circulates a temperature-controlled gas in the chamber of the exposure apparatus. Basically, the temperature-controlled gas is supplied by downflow from the upper side. The temperature-controlled gas is also locally supplied toward the projection optical system 9 and wafer stage 7 (especially near the laser interferometer optical path). To do this, an air outlet port is provided, and a gas filter for trapping fine particles in the gas is attached to the air outlet port.

The air conditioner room 11 incorporates a control unit 30 for the exposure apparatus in its lower space. The control unit 30 controls the operation sequence of the exposure apparatus, drive of the force actuators, drive of the active mounts, and the like.

The operation of the apparatus having the above arrangement will be described next. In the basic operation sequence of the step-and-scan exposure apparatus, step operation for moving the wafer stage stepwise in the X or Y direction to position a shot region where a pattern is to be transferred and scanning operation for performing scanning exposure while synchronously moving the reticle stage 5 and wafer stage 7 in the Y direction are repeated. In the scanning operation, the reticle stage 5 and wafer stage 7 are synchronously moved in opposite directions at a constant speed and a predetermined speed ratio (4:1 in this embodiment) while irradiating the reticle 4 with slit-shaped illumination light under the control of the control unit 30, thereby transferring the entire pattern of the reticle 4 in one shot region of the wafer 6 by scanning exposure.

In driving the reticle stage 5 and wafer stage 7, acceleration is generated by acceleration at the start of scanning and by deceleration at the end of scanning. The linear motors as driving sources for moving the stages must generate a driving force corresponding to <mass of stage moving body>×<acceleration>. This will be described in association with the wafer stage 7. The reaction force of this driving force acts on the linear motor stator in the horizontal direction and is transmitted from the stator to the stage base member 33 through the stage platen 31 supporting the linear motor. The reaction force is generated only in the horizontal direction (Y direction). However, a moment is generated because the barycenter position level of the driving source of the stage 7 and that of the stage base member 33 are different, and therefore, the influence of the reaction force acts on the stage base member 33 not only in the horizontal direction but also in the vertical direction. Natural vibration of the mechanical system of the exposure apparatus excited by the reaction force produces large vibration.

As a basic technical idea of the reaction force reception system for reducing vibration or swing due to the influence of the reaction force, the reaction force with a vibration frequency within a predetermined range generated upon driving the stage is let to escape to the reaction force reception structure isolated from the floor. The vibration frequency within a predetermined range means vibration of, e.g., 10 Hz or more that covers at least a frequency of 20 to 40 Hz as the natural frequency of the floor. That is, the reaction force reception structure itself may vibrate to reduce vibration of the floor. The lower limit value of the predetermined range is not limited to 10 Hz and can be equal to or smaller than the natural frequency of the floor within the range of about 10 to 40 Hz.

To realize it, this embodiment has the movable stage 7 on which a substrate to be exposed is placed, the stage base member 33 supporting the stage 7, and the reaction force reception structure 35 which is different from the stage base member 33 and receives a reaction force according to drive of the stage 7. Transmission of vibration having a predetermined frequency or more is damped between the reaction force reception structure 35 and floor 1.

The control unit 30 controls drive of the force actuators by feedforward control (predictive control) in accordance with drive of the stage. There are two control modes.

As the first mode, the control unit 30 performs feedforward control of the force actuators 38 and 39 in correspondence with acceleration or deceleration of the stage 7, thereby decreasing vibration or swing of the stage base member 33 due to the reaction force in acceleration/deceleration. More specifically, a force corresponding to the force that acts on the force actuators 38 and 39 due to the reaction force is predicted, and a force equivalent to the predicted force is generated by the force actuators 38 and 39 to cancel the reaction force. The force generated by the force actuators 38 and 39 acts on both the stage base member 33 and reaction force reception structure 35. However, since the reaction force reception structure 35 is supported by the floor 1 or base frame 2 through the elastic supports 36 and 37 (corresponding to a mechanical filter means), transmission of high-frequency vibration to the floor 1 is filtered.

As the second mode, the control unit 30 performs feedforward control of the force actuators 38 in correspondence with weight movement according to movement of the stage 7. Since the barycenter position of the stage 7 changes in the horizontal direction as the stage 7 moves, the force for tilting the stage base member 33 acts from the wafer stage 7 on the stage base member 33. To reduce this force, weight shift according to movement of the stage 7 is predicted, and the forces generated by the plurality of vertical force actuators 38 are individually changed. The weight of the stage base member 33 and movable members thereon is basically supported by the three mounts 34. Only the weight change component by the movement is actively compensated for by the force actuators 38.

The control unit 30 performs not only feedforward control but also feedback control. In feedback control, the accelerations (in vertical and horizontal directions) detected by the acceleration sensor 40 attached on the stage base member 33 are fed back to control the vertical and horizontal force actuators 38 and 39, thereby reducing the influence of unpredicted disturbance vibration and further decreasing swing of the wafer stage 7.

The mounts 34 substantially elastically support the stage base member 33 on the floor 1 or base frame 2. The mounts 34 construct a mechanical filter means of certain type and prevent transmission of vibration from the floor 1 to the stage base member 33. With this arrangement, the apparatus of this embodiment satisfies both conditions: (1) vibration due to the driving reaction force of the stage is not transmitted to the floor, and (2) vibration of the floor is not transmitted to the stage 7.

The reaction force reception system on the wafer stage 7 side has been described above in detail. A reaction force reception system based on the same principle is also formed on the reticle stage 5 side. More specifically, the system has the lens-barrel platen 10 supporting the reticle stage 5, the mounts (active mounts 12) through which the lens-barrel platen 10 is substantially supported on the floor 1 or base frame 2 from the lower side, the reaction force reception structure (air conditioner room) 11 which includes the force actuator 22 and receives a reaction force upon driving the reticle stage 5, and the elastic supports 23 through which the reaction force reception structure 11 is substantially elastically supported on the floor 1 or base frame 2. The control unit 30 performs feedforward control of the force actuator 22 to compensate for the influence of the reaction force according to movement of the reticle stage 5. Since the reaction forces of both of the synchronously moving wafer and reticle stages are received, an excellent step-and-scan exposure apparatus with minimum floor vibration can be provided.

According to the above embodiment, in the step-and-scan exposure apparatus, a plurality of (12) interferometers for obtaining position information necessary for control of exposure operations is classified into the group of a plurality of (4) X-Y laser interferometers 17 for measuring the position of the wafer stage 7 in the X and Y directions, the group of a plurality of (4) Z interferometers 16 for measuring the position of the wafer stage 7 in the Z direction, and the group of a plurality of (4) X-Y laser interferometers 41 for measuring the position of the reticle stage 5 in the X and Y directions. These groups have laser heads, respectively, and these laser heads are synchronized with each other.

Figure 5:
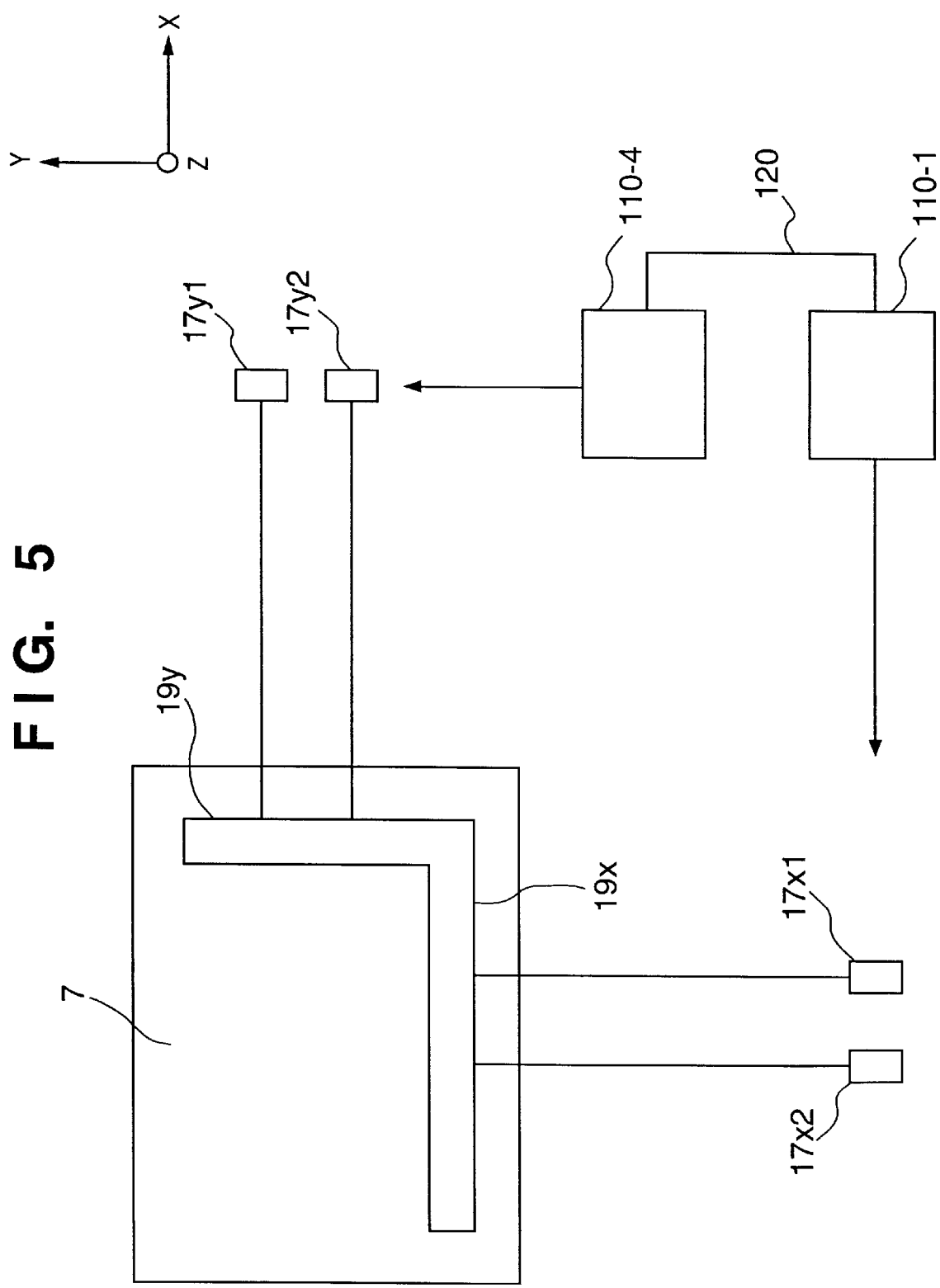
FIG. 5 is a view showing the layout of laser heads according to another embodiment of the present invention.

However, the present invention is not limited to this, and various changes and modifications can be made. For example, as shown in FIG. 5, the plurality of interferometers for measuring the position of the wafer stage 7 may be classified into the group consisting of the interferometers 17x1 and 17x2 for measuring the position in the X direction, and the group consisting of the interferometers 17y1 and 17y2 for measuring the position in the Y direction, and the laser heads 110-1 and 110-4 may be assigned to the groups, respectively. The plurality of interferometers for measuring the position of the reticle stage 5 may also be classified into the group consisting of interferometers for measuring the position in the X direction and the group consisting of the interferometers for measuring the position in the Y direction, and laser heads may be individually assigned to the groups. These laser heads are connected by the cables 120, as shown in FIG. 4, and synchronously driven.

One laser head may be used in correspondence with each measurement axis, i.e., each interferometer (in this case, the number of groups matches the number of interferometers)

When a plurality of interferometers are divided into a plurality of groups, and laser heads are individually assigned to the groups and synchronously driven, the problem associated with the decrease in amount of reference light due to an increase in number of interferometers can be solved. In other words, the output of each laser head can be decreased, and the laser heads can be made compact. In addition, according to the present invention, the number of optical components necessary to divide or guide reference light can be decreased. Furthermore, the designer is relieved from cumbersome design for ensuring an optical path for guiding reference light.

According to the scanning exposure apparatus with the above arrangement, the stage position on a plurality of axes is measured by interference of laser beams (reference light) generated by the plurality of laser heads. For this reason, even when the number of measurement axes increases, the light amount of a laser beam for each axis can be prevented from decreasing. In addition, since the laser heads are synchronously driven, any relative error in measured value due to the difference in oscillation frequency or phase can be prevented. As a consequence, the relative error in measured value of each axis can be reduced, and the synchronization or positioning accuracy of stage movement can be increased.

The number of optical elements for dividing a beam or guiding the optical path can be decreased. Also, the layout and shapes of members in the apparatus can be designed without blocking the optical path or passing the optical path near or above the heat generation portion. That is, according to the scanning exposure apparatus having the above arrangement, the number of optical elements required to divide or guiding a laser beam can be decreased. In addition, limitations on design are reduced, so the space where a laser beam passes through can be made small.

<Embodiment of Microdevice Manufacture>

Figure 6:
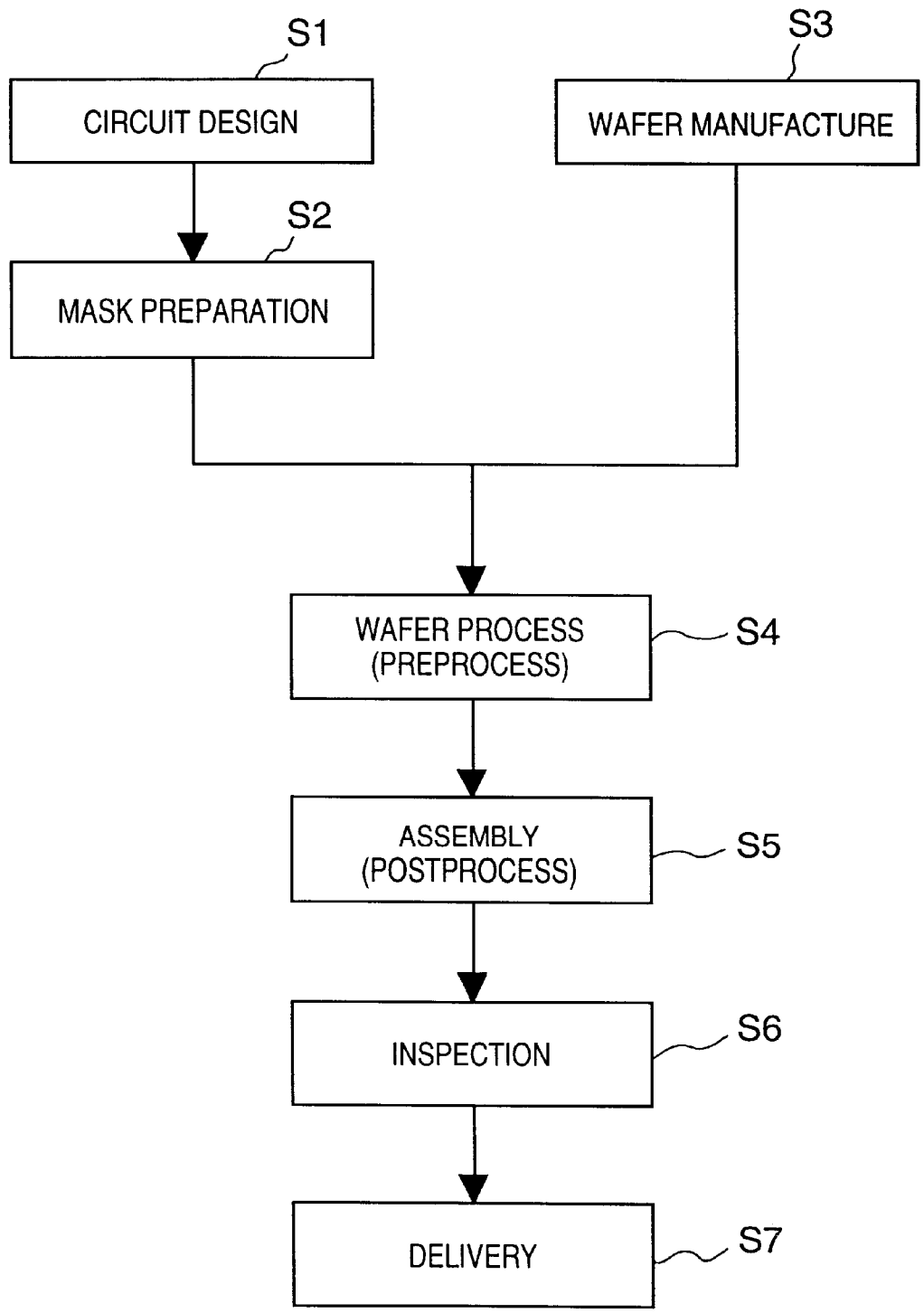
FIG. 6 is a flow chart showing the flow of manufacturing semiconductor devices.

An example of device manufacture using the above-described exposure apparatus will be described next. FIG. 6 shows the flow of manufacturing a microdevice (e.g., a semiconductor chip such as an IC or an LSI, liquid crystal panel, CCD, thin-film magnetic head, or micromachine). In step 1 (circuit design), the pattern of a device is designed. In step 2 (reticle preparation), a reticle having the designed pattern is prepared. In step 3 (substrate manufacture), a substrate is manufactured using a material such as silicon or glass. In step 4 (substrate process) called a preprocess, an actual circuit is formed on the substrate by lithography using the prepared reticle and substrate. In step 5 (assembly) called a post-process, a semiconductor chip is formed from the substrate prepared in step 4. This step includes processes such as assembly (dicing and bonding) and packaging (chip encapsulation). In step 6 (inspection), inspections including an operation check test and a durability test of the semiconductor device manufactured in step 5 are performed. A semiconductor device is completed with these processes and delivered (step 7).

FIG. 7 shows details of the substrate process. In step 11 (oxidation), the surface of the substrate is oxidized. In step 12 (CVD), an insulating film is formed on the substrate surface. In step 13 (electrode formation), an electrode is formed on the substrate by deposition. In step 14 (ion implantation), ions are implanted into the substrate. In step 15 (resist process), a resist is applied to the substrate. In step 16 (exposure), the circuit pattern of the reticle is printed on the substrate by exposure using the above-described exposure apparatus. In step 17 (development), the exposed substrate is developed. In step 18 (etching), portions other than the developed resist image are etched. In step 19 (resist peeling), the unnecessary resist remaining after etching is removed. By repeating these steps, a multilayered structure of circuit patterns is formed on the substrate. When the production method of this embodiment is used, a precision device which is conventionally difficult to manufacture can be manufactured at high productivity, i.e., at low cost.

According to the present invention, for example, since a sufficient amount of reference light can be ensured for laser interferometers, the stage measurement accuracy is improved. Hence, in, e.g., a scanning exposure apparatus, the wafer stage and reticle stage can be accurately synchronously scanned.

According to the present invention, the design of an optical path for measurement using interferometers can be simplified, and the degree of freedom in design can be greatly increased.

Improvement of the measurement system using interferometers can be applied not only to a scanning exposure apparatus but also to an exposure apparatus of another type having a plurality of interferometers. The above-described effect can be obtained even when the present invention is applied to an exposure apparatus of another type.

When the exposure apparatus of the present invention is used, devices can be manufactured more precisely as compared to the prior art.

The present invention is not limited to the above embodiments and various changes and modifications can be made within the spirit and scope of the present invention. Therefore, to apprise the public of the scope of the present invention, the following claims are made.

What is claimed is:

1. An exposure apparatus which has a substrate stage, a master stage, a projection optical system projecting an image of a master held by said master stage onto a substrate on said substrate stage, a first interferometer measuring a position of said substrate stage, and a second interferometer measuring a position of said master stage, and projects the image of the master onto the substrate by exposure while driving said substrate stage and said master stage on the basis of measurement results by said first and second interferometers, said apparatus comprising:

a first light generation section providing first light to said first interferometer;

a second light generation section providing second light to said second interferometer; and synchronization means for synchronizing said first light generation section and said second light generation section with each other.

2. The apparatus according to claim 1, wherein said synchronization means comprises a reference signal generation circuit generating a reference signal (ref-out), and said first and second light generation sections are synchronized with each other by being supplied the reference signal (ref-out) from said reference signal generation circuit.

3. The apparatus according to claim 2, wherein the reference signal is an excitation signal.

4. The apparatus according to claim 3, wherein each of said first and second light generation sections comprises:

an amplifier amplifying the excitation signal supplied from said reference signal generation circuit; and a laser tube generating a laser beam as the light in accordance with an output signal from said amplifier.

5. The apparatus according to claim 1, wherein said first interferometer is ad ed to measure the position of said substrate stage in the horizontal direction, and said apparatus further comprises:

a third interferometer measuring the position of the substrate stage in the vertical direction; and a third light generation section providing third light to said third interferometer, wherein said synchronization means is adapted to synchronize said first light generation section, said second light generation section, and said third light generation section with each other.

6. The apparatus according to claim 1, further comprising a lens-barrel platen supporting said projection optical system, said lens-barrel platen being elastically supported by a mount.

7. The apparatus according to claim 6, wherein said substrate stage and said lens-barrel platen are insulated from each other in association with vibration.

8. The apparatus according to claim 6, wherein said first and second interferometers are fixed with reference to said lens-barrel platen.

9. The apparatus according to claim 8, wherein said master stage is fixed to a master stage platen fixed to said lens-barrel platen through a support frame.

10. The apparatus according to claim 6, wherein said first and second light generation sections are fixed with reference to said lens-barrel platen.

11. The apparatus according to claim 6, wherein said first and second interferometers and said first and second light generation sections are fixed with reference to said lens-barrel platen.

12. The apparatus according to claim 1, further comprising a reaction force reception structure receiving a reaction force generated upon driving said substrate stage.

13. The apparatus according to claim 1, further comprising a reaction force reception structure receiving a reaction force generated upon driving said master stage.

14. The apparatus according to claim 1, further comprising a first reaction force reception structure receiving a reaction force generated upon driving said substrate stage, and a second reaction force reception structure receiving a reaction force generated upon driving said master stage.

15. The apparatus according to claim 12, wherein said apparatus further comprises a stage base member supporting said substrate stage, wherein said reaction force reception structure receives a reaction force generated upon driving said substrate stage from said stage base member.

16. The apparatus according to claim 12, further comprising an elastic support elastically supporting said reaction force reception structure on a floor, said elastic support damping transmission of vibration having not less than a predetermined frequency between said reaction force reception structure and the floor.

17. The apparatus according to claim 15, further comprising a force actuator applying a force between said stage base member and said reaction force reception structure.

18. The apparatus according to claim 17, wherein said force actuator comprises:
 a vertical force actuator generating a force in the vertical direction; and
 a horizontal force actuator generating a force in the horizontal direction.

19. The apparatus according to claim 17, wherein said force actuator comprises a linear motor.

20. The apparatus according to claim 18, wherein a barycenter of said substrate stage and a position at which said horizontal force actuators apply the force to said stage base member are substantially at the same level.

21. The apparatus according to claim 15, further comprising mount elastically supporting said stage base member on the floor.

22. The apparatus according to claim 15, wherein said reaction force reception structure is arranged underneath said stage base member.

23. The apparatus according to claim 16, wherein the frequency is higher than a natural frequency of the floor.

24. The apparatus according to claim 16, wherein the frequency is higher than 10 Hz.

25. The apparatus according to claim 1 her comprising a control unit for controlling operation of sequentially transferring a pattern onto a plurality of regions on the substrate by scanning and exposure using a step-and-scan scheme while driving said substrate stage and said master stage in synchronism with each other.

26. An exposure apparatus having a substrate stage and a projection optical system projecting a pattern onto a substrate on said substrate stage, said apparatus comprising:
 a plurality of interferometers obtaining position information necessary for positioning the substrate and the pattern;
 a control section controlling an exposure operation on the basis of measurement results by said plurality of interferometers;
 a first light generation section providing first light to interferometers of said plurality of interferometers, which belong to a first group;
 a second light generation section providing second light to interferometers of said plurality of interferometers, which belong to a second group; and
 synchronization means for synchronizing said first light generation section and said second light generation section with each other.

27. An exposure apparatus having a substrate stage and a projection optical system projecting a pattern onto a substrate on said substrate stage, said apparatus comprising:
 a plurality of interferometers obtaining position information necessary for positioning the substrate and the pattern, said plurality of interferometers being classified into a plurality of groups;
 a control section controlling exposure operation on the basis of measurement results by said plurality of interferometers;
 a plurality of light generation sections providing common light to interferometers belonging to the respective groups; and
 synchronization means for synchronizing said plurality of light generation sections with each other.

28. An exposure apparatus which has a substrate stage, a master stage, a projection optical system projecting an image of a master held by said master stage onto a substrate on said substrate stage, a plurality of interferometers measuring positions of said substrate stage and said master stage, and projects the image of the master onto the substrate by exposure while driving said substrate stage and said master stage on the basis of measurement results by said plurality of interferometers, said apparatus comprising:

a first light generation section providing first light to interferometers of said plurality of interferometers, which belong to a first group;

a second light generation section providing second light to interferometers of said plurality of interferometers, which belong to a second group; and synchronization means for synchronizing said first light generation section and said second light generation section with each other.

29. An exposure apparatus which has a substrate stage, a master stage, a projection optical system projecting an image of a master held by said master stage onto a substrate on said substrate stage, a plurality of interferometers measuring positions of said substrate stage and said master stage, and projects the image of the master onto the substrate by exposure while driving said substrate stage and said master stage on the basis of measurement results by said plurality of interferometers, said plurality of interferometers being classified into a plurality of groups, said apparatus comprising:

a plurality of light generation sections providing common light to interferometers belonging to the respective groups; and synchronization means for synchronizing said plurality of light generation sections with each other.

30. A method of manufacturing a device, comprising the steps of:

applying a resist to a substrate;

placing the substrate on a substrate stage of an exposure apparatus and transferring a pattern onto the substrate by exposure using said exposure apparatus; and developing the substrate, wherein said exposure apparatus comprises the substrate stage, a master stage, a projection optical system projecting an image of a master held by said master stage onto the substrate on said substrate stage, a first interferometer measuring a position of said substrate stage, a second interferometer measuring a position of said master stage, a first light generation section providing first light to said first interferometers, a second light generation section providing second light to said second interferometers, and synchronization means for synchronizing said first light generation section and said second light generation section with each other, and projects the image of the master onto the substrate by exposure while driving said substrate stage and said master stage on the basis of measurement results by said first and second interferometers.

31. A method of manufacturing a device, comprising the steps of:

applying a resist to a substrate;

placing the substrate on a substrate stage of an exposure apparatus and transferring a pattern onto the substrate by exposure using said exposure apparatus; and developing the substrate, wherein said exposure apparatus comprises the substrate stage, a projection optical system projecting a pattern onto the substrate on said substrate stage, a plurality of interferometers obtaining position information necessary for positioning the substrate and the pattern, a control section controlling an exposure operation on the basis of measurement results by said plurality of interferometers, a first light generation section providing first light to interferometers of said plurality of interferometers, which belong to a first group, a second light generation section providing second light to interferometers of said plurality of interferometers, which belong to a second group, and synchronization means for synchronizing said first light generation section and said second light generation section with each other.

32. A method of manufacturing a device, comprising the steps of:

applying a resist to a substrate;

placing the substrate on a substrate stage of an exposure apparatus and transferring a pattern onto the substrate by exposure using said exposure apparatus; and developing the substrate, wherein, said exposure apparatus comprises the substrate stage, a projection optical system projecting a pattern onto the substrate on said substrate stage, a plurality of interferometers obtaining position information necessary for positioning the substrate and the pattern, said plurality of interferometers being classified into a plurality of groups, a control section controlling exposure operation on the basis of measurement results by said plurality of interferometers, a plurality of light generation sections providing common light to interferometers belonging to the respective groups, and synchronization means for synchronizing said plurality of light generation sections with each other.

33. A method of manufacturing a device, comprising the steps of:

applying a resist to a substrate;

placing the substrate on a substrate stage of an exposure apparatus and transferring a pattern onto the substrate by exposure using said exposure apparatus; and developing the substrate, wherein, said exposure apparatus comprises the substrate stage, a master stage, a projection optical system projecting an image of a master held by said master stage onto the substrate on said substrate stage, a plurality of interferometers measuring positions of said substrate stage and said master stage, a first light generation section providing first light to interferometers of said plurality of interferometers, which belong to a first group, a second light generation section providing second light to interferometers of said plurality of interferometers, which belong to a second group, and synchronization means for synchronizing said first light generation section and said second light generation section with each other, and projects the image of the master onto the substrate by exposure while driving said substrate stage and said master stage on the basis of measurement results by said plurality of interferometers.

34. A method of manufacturing a device, comprising the steps of:

applying a resist to a substrate;

placing the substrate on a substrate stage of an exposure apparatus and transferring a pattern onto the substrate by exposure using said exposure apparatus; and developing the substrate, wherein, said exposure apparatus comprises the substrate stage, a master stage, a projection optical system projecting an image of a master held by said master stage onto the substrate on said substrate stage, a plurality of interferometers measuring positions of said substrate stage and said master stage, said plurality of interferometers being classified into a plurality of groups, a plurality of light generation sections providing common light to interferometers belonging to the respective groups, and synchronization means for synchronizing said plurality of light generation sections with each other, and projects the image of the master onto the substrate by exposure while driving said substrate stage and said master stage on the basis of measurement results by said plurality of interferometers.

35. An exposure apparatus for projecting an image of a master onto a substrate via a projection optical system by exposure, said apparatus comprising:

a substrate stage:

a first interferometer having a function of measuring a position of said substrate stage, said first interferometer using a light beam from a first laser light source unit;

a master stage;

a second interferometer having a function of measuring a position of said master stage, said second interferometer using a light beam from a second laser light source unit;

a control device controlling driving of said substrate stage and said master stage, the exposure being performed while said substrate stage holding the substrate and said master stage holding the master are driven by means of the control of said control device on the basis of measurement results by said first and second interferometers;

a reference signal generation circuit; and a signal circuit system connecting between said reference signal generation circuit and said first and second laser light source units, wherein said first and second laser light source units are synchronized with each other by being supplied a reference signal from said reference signal generation circuit.

* * * * *

UNITED STATES PATENT AND TRADEMARK OFFICE
CERTIFICATE OF CORRECTION

PATENT NO. : 6,462,828 B1
DATED : October 8, 2002
INVENTOR(S) : Hiroaki Takeishi It is certified that error appears in the above-identified patent and that said Letters Patent is hereby corrected as shown below:

Title page,
Item [56], U.S. PATENT DOCUMENTS, "5,682,240 A 10/1997 Reditz" should read -- 5,682,240 A 10/1997 Redlitz --.

Column 7,
Line 43, "Actually,when" should read -- Actually, when --.

Column 9,
Line 25, "structure" should read -- structure 35. --.

Column 12,
Line 28, "both of" should read -- both --.
Line 63, "interferometers)" should read -- interferometers). --.

Column 14,
Line 64, "ad ed" should read -- adapted --.

Column 16,
Line 11, "mount" should read -- a mount --.
Line 22, "1 her" should read -- 1, further --.

Signed and Sealed this

Thirteenth Day of May, 2003

JAMES E. ROGAN
*Director of the United States Patent and Trademark Office*